(12) United States Patent
Song et al.

(10) Patent No.: US 11,864,370 B2
(45) Date of Patent: Jan. 2, 2024

(54) METHOD FOR FABRICATING SEMICONDUCTOR DEVICE

(71) Applicant: SK hynix Inc., Gyeonggi-do (KR)

(72) Inventors: Kang Yoo Song, Gyeonggi-do (KR); Mi Na Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/737,393

(22) Filed: May 5, 2022

(65) Prior Publication Data

US 2023/0110314 A1 Apr. 13, 2023

(30) Foreign Application Priority Data

Oct. 13, 2021 (KR) ........................ 10-2021-0135757

(51) Int. Cl.
*H10B 12/00* (2023.01)
*H01L 21/28* (2006.01)
*H01L 49/02* (2006.01)

(52) U.S. Cl.
CPC ..... *H10B 12/033* (2023.02); *H01L 21/28238* (2013.01); *H01L 28/91* (2013.01); *H01L 28/92* (2013.01); *H10B 12/315* (2023.02); *H10B 12/318* (2023.02)

(58) Field of Classification Search
CPC ............ H10B 12/02–03; H10B 12/033; H10B 12/0335; H10B 12/30; H10B 12/31; H10B 12/315; H10B 12/318; H01L 28/40; H01L 28/90–92; H01L 21/28238
See application file for complete search history.

(56) References Cited

U.S. PATENT DOCUMENTS

| 8,927,384 B2 | 1/2015 | Kim et al. | |
| 2012/0326274 A1* | 12/2012 | Doyle | H01L 28/91 |
| | | | 438/386 |
| 2012/0329236 A1* | 12/2012 | Ueda | H01L 28/91 |
| | | | 257/E21.011 |

FOREIGN PATENT DOCUMENTS

| KR | 10-2014-0055366 A | 5/2014 |
| KR | 10-1651404 B1 | 8/2016 |

\* cited by examiner

*Primary Examiner* — Jose R Diaz
(74) *Attorney, Agent, or Firm* — IP & T GROUP LLP

(57) ABSTRACT

Present invention relates to a method of fabricating a semiconductor device that can facilitate the processes of etching a supporter and removing a mold layer. According to the present invention, a method of fabricating a semiconductor device semiconductor device comprises: sequentially forming a substructure over a substrate and a etch stop layer over the substructure; forming a stack structure of alternately stacked mold layers and supporter layers over the etch stop layer; forming a plurality of supporter holes in the stack structure exposing the etch stop layer; forming a sacrificial layer filling each of the plurality of the supporter holes; forming a plurality of lower electrode openings exposing the substructure by etching the sacrificial layer and the stack structure; and forming a lower electrode inside the plurality of lower electrode openings.

23 Claims, 19 Drawing Sheets

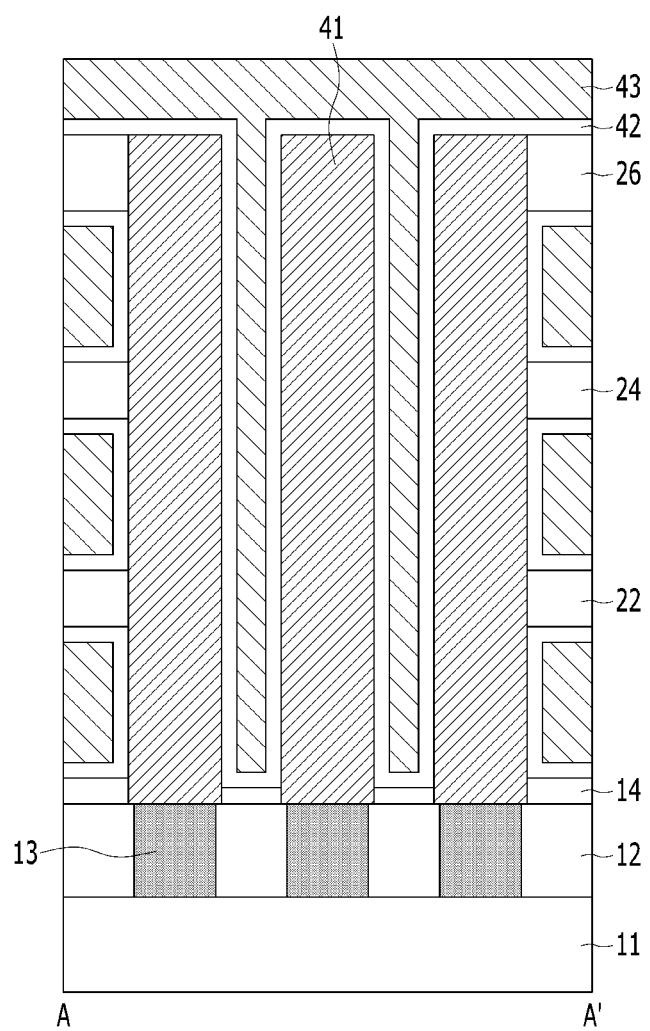

METHOD FOR FABRICATING SEMICONDUCTOR DEVICE

CROSS-REFERENCE TO RELATED APPLICATIONS

The present application claims priority to Korean Patent Application No. 10-2021-0135757, filed on Oct. 13, 2021, which is incorporated herein by reference in its entirety.

BACKGROUND

1. Field

The present invention relates to a method of fabricating a semiconductor device, and more particularly, to a method of fabricating a semiconductor device including a capacitor.

2. Description of the Related Art

As the trend of high integration of semiconductor devices intensifies, in order to increase the capacitance of the capacitor within a limited planar area, the height of the capacitor is increased. However, as the height of the capacitor is increased, the reliability of the DRAM device may be deteriorated. For example, bending or inclination of the capacitor may occur, and thus the reliability of the DRAM device may be deteriorated.

SUMMARY

Embodiments of the present invention provide a method of fabricating a semiconductor device capable of facilitating a supporter etching process and a mold layer removal process.

A method of fabricating a semiconductor device comprises: semiconductor device according to an embodiment of the present invention comprises: sequentially forming a substructure over a substrate and a etch stop layer over the substructure; forming a stack structure of alternately stacked mold layers and supporter layers over the etch stop layer; forming a plurality of supporter holes in the stack structure exposing the etch stop layer; forming a sacrificial layer filling each of the plurality of the supporter holes; forming a plurality of lower electrode openings exposing the substructure by etching the sacrificial layer and the stack structure; and forming a lower electrode inside the plurality of lower electrode openings.

According to the present invention, the supporter hole is formed in advance to facilitate the dip-out process and to prevent damage to the lower electrode, thereby improving the reliability of the semiconductor device.

DETAILED DESCRIPTION

Figure 1A:
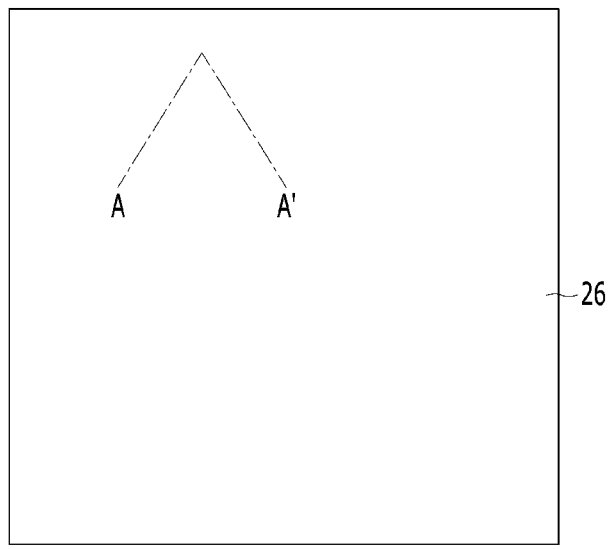
FIGS. 1A to 7B are plan views and cross-sectional views illustrating a method of fabricating a semiconductor device according to an embodiment of the present invention.

Various embodiments described herein will be described with reference to cross-sectional views, plan views and block diagrams, which are schematic views of the present invention. Therefore, the structures of the drawings may be modified by fabricating technology and/or tolerances. Various embodiments of the present invention are not limited to the specific structures shown in the drawings, but include any changes in the structures that may be produced according to the fabricating process. Also, any regions and shapes of regions illustrated in the drawings are intended to illustrate specific examples of structures of regions of the various elements, and are not intended to limit the scope of the invention. Sizes and relative sizes of elements shown in the drawings may be exaggerated for clarity of description. Like reference numerals refer to like elements throughout, and "and/or" includes each and every combination of one or more of the recited items.

Reference to an element or layer "on" another element or layer includes not only the case where an element is directly on another element or layer, but also the case where there are other intervening layers or elements. The terminology used herein is for the purpose of describing the embodiments and is not intended to limit the present invention. In this specification, the singular also includes the plural, unless specifically stated otherwise in the phrase.

Figure 8A:
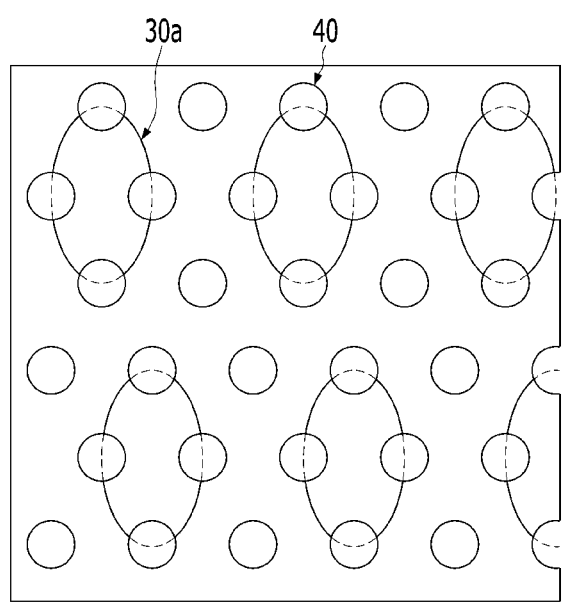
FIGS. 8A to 8C are plan views illustrating a supporter hole according to an embodiment of the present invention.
Figure 8B:
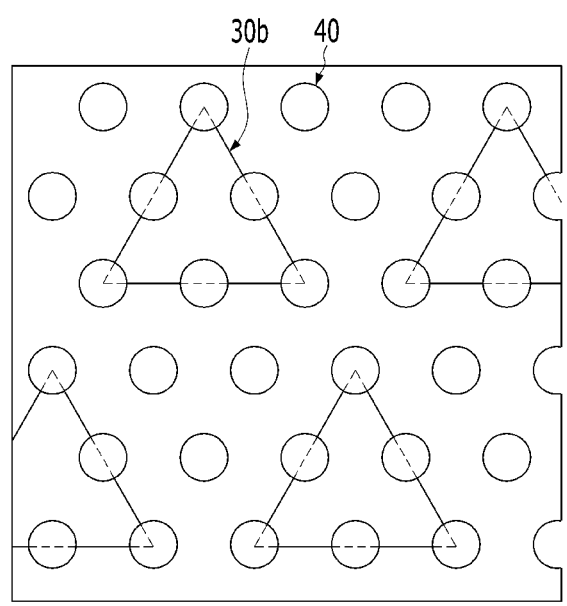
Figure 8C:
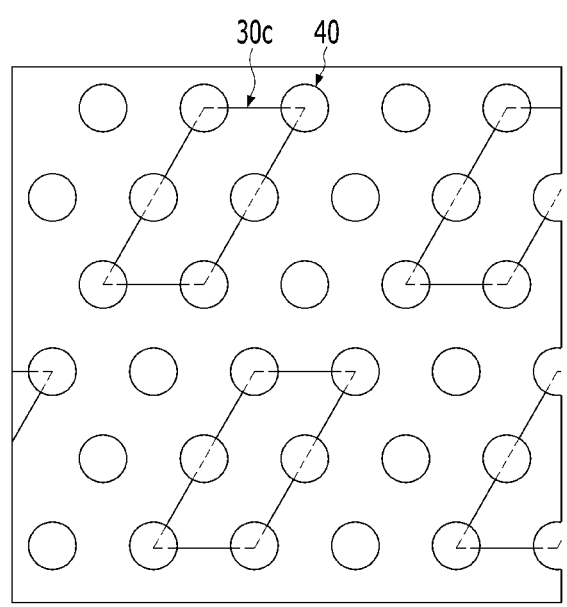
Figure 9A:
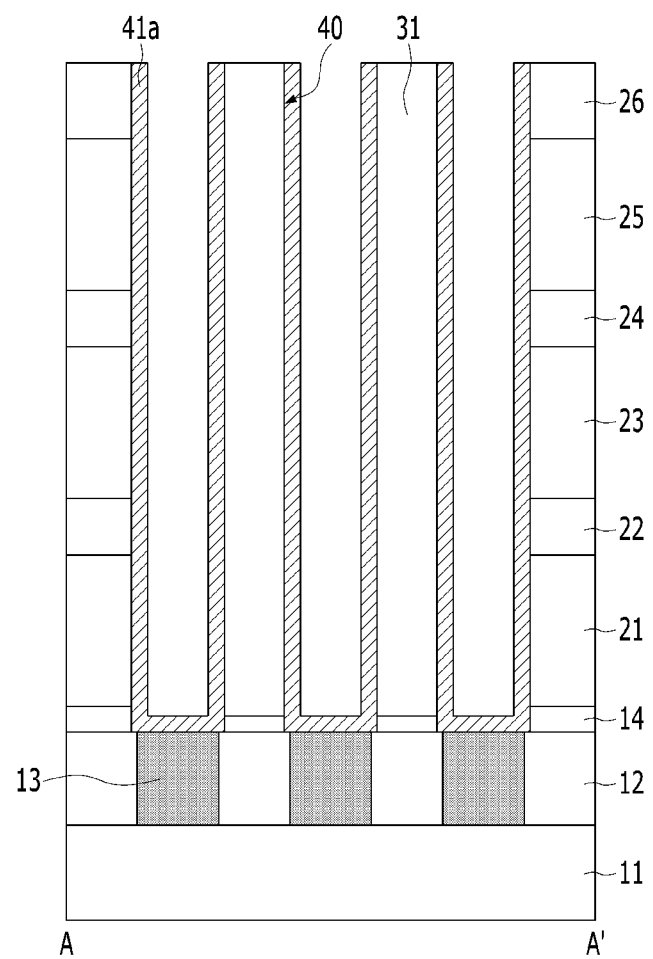
FIGS. 9A and 9B are cross-sectional views illustrating a lower electrode according to an embodiment of the present invention.
Figure 9B:
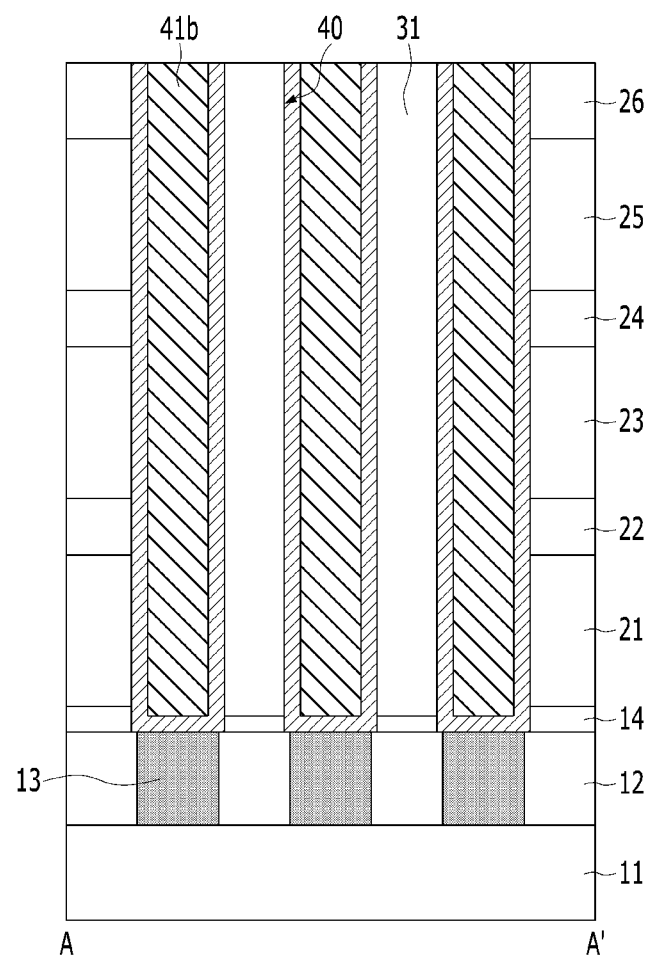

FIGS. 1A to 7B are plan views and cross-sectional views illustrating a method of fabricating a semiconductor device according to an embodiment with "a" in each figure showing a plan view, and "b" in each figure showing a cross-sectional view taken along line A-A' of each plan view. FIGS. 8A to 8C are plan views illustrating a supporter hole according to an embodiment of the present invention. FIGS. 9A and 9B are cross-sectional views illustrating lower electrodes according to an embodiment of the present invention.

Figure 1B:
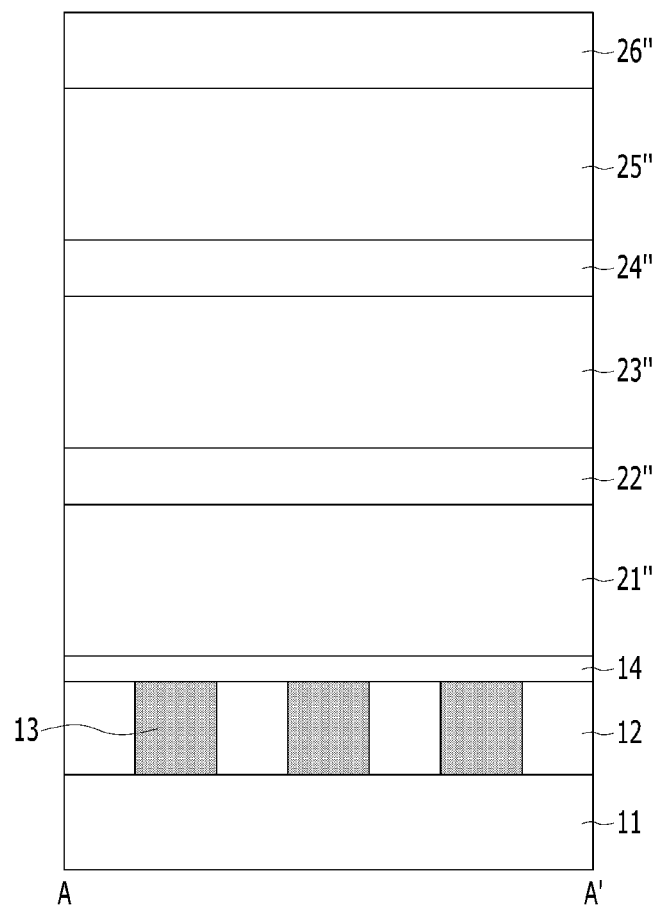

As shown in FIGS. 1A and 1B, an interlayer dielectric layer 12 including a plurality of storage node contact plugs 13 is formed on a substrate 11. The interlayer dielectric layer 12 together with the plurality of storage node contact plugs 13 is also referred to herein as a substructure and it is only example of a suitable substructure which may be formed on the substrate 11. The interlayer dielectric layer 12 may be to be in direct contact with the substrate 11 but the invention is not limited only to such configuration. The storage node contact plug 13 may include a plurality of storage node contact plugs spaced apart at a regular interval along the A-A' line direction. An etch stop layer 14 is formed on the interlayer dielectric layer 12. The etch stop layer 14 may be formed to be in direct contact with the interlayer dielectric layer 12. Each of the storage node contact plugs 13 may pass through the interlayer dielectric layer 12. The etch stop layer 14 may be thinner than the interlayer dielectric layer. Next, a first mold layer 21", a first supporter layer 22", a second mold layer 23", a second supporter layer 24", a third mold layer 25" and a third supporter layer 26" are sequentially stacked on the etch stop layer 14 to form a stack structure. Although the present embodiment shows a stack structure in which three mold layers and three supporter layers are alternately and sequentially stacked, the present invention is not limited thereto. The stack structure according to an embodiment of the present invention may include a stack structure in which first to nth mold layers and first to nth supporter layers are stacked in an alternating manner. Preferably two or more supporter layers and mold layers may be stacked in the alternating manner.

A buried gate structure may be formed in the substrate 11, and a bit line structure may be disposed between the storage node contact plugs 13 on the substrate 11.

The substrate 11 may be a material suitable for semiconductor processing. The substrate 11 may include a semiconductor substrate. The substrate 11 may be made of a silicon-containing material. The substrate 11 may include silicon, monocrystalline silicon, polysilicon, amorphous silicon, silicon germanium, monocrystalline silicon germanium, polycrystalline silicon germanium, carbon doped silicon, a combination thereof, or a multilayer thereof. The substrate 11 may include other semiconductor materials such as germanium. The substrate 11 may include a III/V semiconductor substrate, for example, a compound semiconductor substrate such as GaAs. The substrate 11 may include a silicon on insulator (SOI) substrate.

The interlayer dielectric layer 12 may include a single-layer or multi-layered dielectric material. The interlayer dielectric layer 12 may include a multi-layered dielectric material, each layer having the same etch selectivity. The interlayer dielectric layer 12 may include a multi-layered dielectric material, each layer having different etch selectivity. The interlayer dielectric layer 12 may include nitride, oxide, oxynitride, or a combination thereof.

The storage node contact plug 13 may pass through the interlayer dielectric layer 12 and connect to the substrate 11. One end of the storage node contact plug 13 may directly contact a bonding region of the substrate 11. The other end of the storage node contact plug 13 may directly contact the lower electrode in a subsequent process. The storage node contact plug 13 may electrically connect the substrate 11 and the lower electrode of the capacitor to be formed.

The etch stop layer 14 may serve to protect the lower layers including the interlayer dielectric layer 12 and the like during subsequent fabricating processes such as etching of an upper layer.

The etch stop layer 14 may include a material having an etch selectivity with respect to the first to third mold layers 21", 23", and 25". In another embodiment, the etch stop layer 14 may include a material having an etch selectivity with respect to the first to third mold layers 21", 23", and 25" and the first to third supporter layers 22", 24", and 26". The etch stop layer 14 may include a dielectric material. For example, the dielectric material may include a nitride, an oxide, an oxynitride, or a combination thereof.

On the etch stop layer 14, the first mold layer 21", the first supporter layer 22", the second mold layer 23", the second supporter layer 24", the third mold layer 25", and the third supporter layer 26" may be sequentially stacked to form a stack structure. In the present embodiment, the mold layer and the supporter layer are stacked three times, but the present invention is not limited thereto. In another embodiment, the stack structure may include at least two or more alternately stacked mold layers and supporter layers.

The stack structure is for providing an opening for forming the lower electrode of the capacitor. The thickness of the stack structure may be adjusted to be at least equal to the height of the lower electrode of the capacitor. The first to third mold layers 21", 23", and 25" may include a material having wet etch selectivity with respect to the first to third supporter layers 22", 24", and 26". The first to third mold layers 21", 23", and 25" may include a material having an etch selectivity with respect to the etch stop layer 14. The first to third mold layers 21", 23", 25" may be formed using a deposition process such as chemical vapor deposition (CVD) or physical vapor deposition (PVD). The first to third mold layers 21", 23", and 25" may include a dielectric material. For example, the first to third mold layers 21", 23", and 25" may include silicon oxide.

The first to third supporter layers 22", 24", and 26" may serve to prevent the lower electrode from leaning in a subsequent dip-out process. In the stack structure, the upper-most supporter layer may be thicker than the lower supporter layers. In the present embodiment, the thickness of the third supporter layer 26" may be greater than the thicknesses of the first and second supporter layers 22" and 24". The first to third supporter layers 22", 24", and 26" may include a material having a wet etch selectivity with respect to the first to third mold layers 21", 23", and 25". The first to third supporter layers 22", 24", and 26" may include a dielectric material. For example, the first to third supporter layers 22", 24", and 26" may include silicon nitride.

Figure 2A:
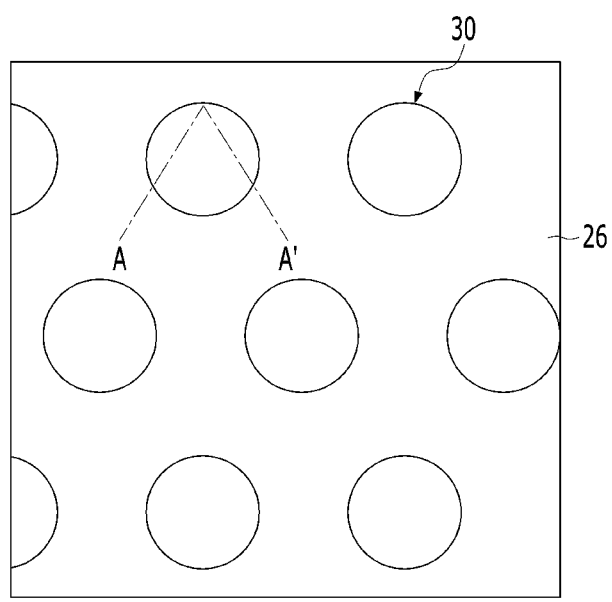
Figure 2B:
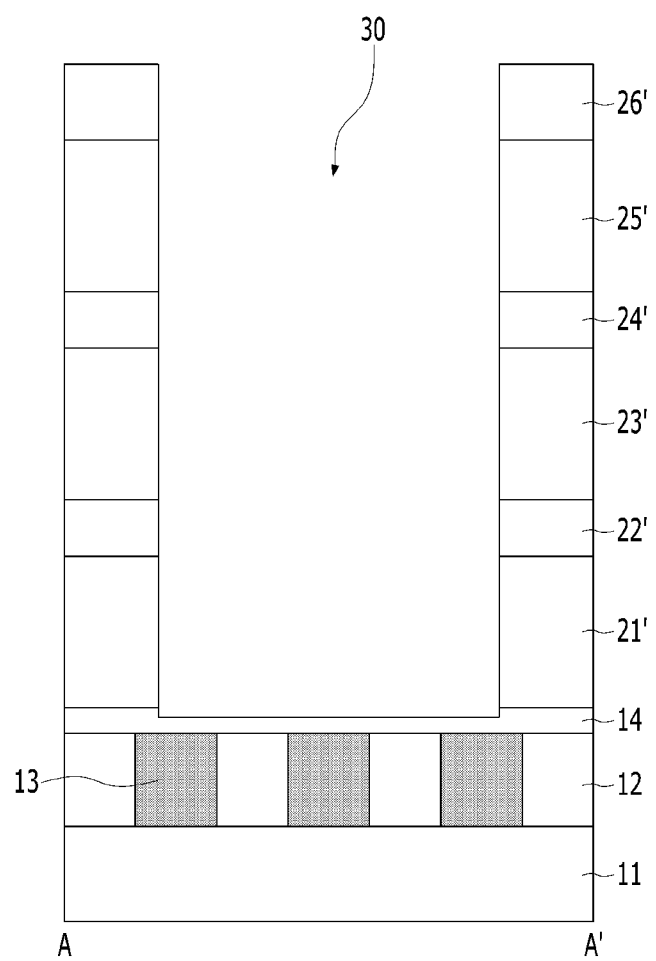

As shown in FIGS. 2A and 2B, a supporter hole 30 is formed by etching the stack structure. The supporter hole 30 provides a passage through which an etchant is introduced in a subsequent dip-out process. The etched stack structure includes a stack structure of a first mold pattern 21', a first supporter pattern 22', a second mold pattern 23', a second supporter pattern 24', a third mold pattern 25' and a third supporter pattern 26'.

Each supporter hole 30 may overlap with a portion of the plurality of storage node contact plugs 13. Each supporter hole 30 may overlap with a portion of at least two or more storage node contact plugs 13.

The supporter hole 30 may be formed by forming a mask and patterning the mask to define the supporter hole 30 on the third supporter layer 26" (refer to FIG. 1B), and then using the mask pattern to etch the stack structure through a series of processes. The mask pattern may include a photoresist layer.

The supporter hole 30 may be formed through a series of processes sequentially etching the third supporter layer 26", the third mold layer 25", the second supporter layer 24", and the second mold layer 23", the first supporter layer 22", and the first mold layer 21" by using the mask pattern as an etching barrier. For example, when the etch stop layer 14 is formed of a material having an etch selectivity with respect to the first to third mold layers 21", 23", and 25", the supporter hole 30 may be formed through a series of etching processes. The series of etching processes may alternatively perform processes of etching the supporter layers with an etching gas and etching the mold layers with an etching gas until the etch stop layer 14 is exposed. In another embodiment, when the etch stop layer 14 is formed of a material having an etch selectivity with respect to the first to third mold layers 21", 23", and 25" and the first to third support layers 22", 24", and 26", the supporter hole 30 may be formed through one etching process until the etch stop layer 14 is exposed.

The etching process for forming the supporter hole 30 may use the etch stop layer 14 as an etch stop target. From the moment when the supporter hole 30 is formed, the etch stop layer 14 may be etched to a predetermined thickness.

A plurality of supporter holes 30 may be arranged in a zigzag pattern as shown in FIG. 2A on a plan view. The plurality of supporter holes 30 may be disposed to be spaced apart from each other by a predetermined interval. Although circular supporter holes are illustrated in the present embodiment, the present disclosure is not limited to circular supporter holes 30 only. In an embodiment, as shown in FIG. 8A, the supporter holes 30a may be arranged in a pattern shape including a curve such as an ellipse. In an embodiment, as shown in FIG. 8B, the supporter holes 30b may be arranged in a pattern having a triangular shape. In an embodiment, as shown in FIG. 8C, the supporter hole 30c may be formed in a pattern having an inclined quadrangle shape.

In an embodiment, the supporter hole 30 may be formed in one of a polygonal shape, a bar shape, and a line shape.

The supporter hole 30 according to the present embodiment may be formed in various sizes and various shapes to the extent that the lower electrode not supported by the supporter does not exist.

Figure 3A:
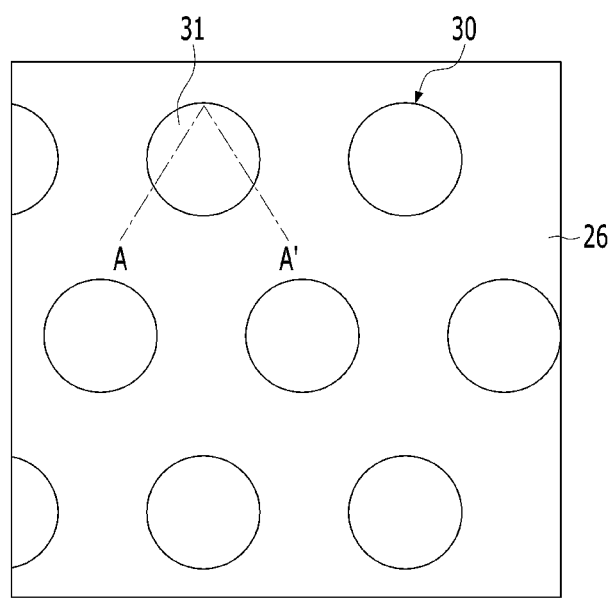
Figure 3B:
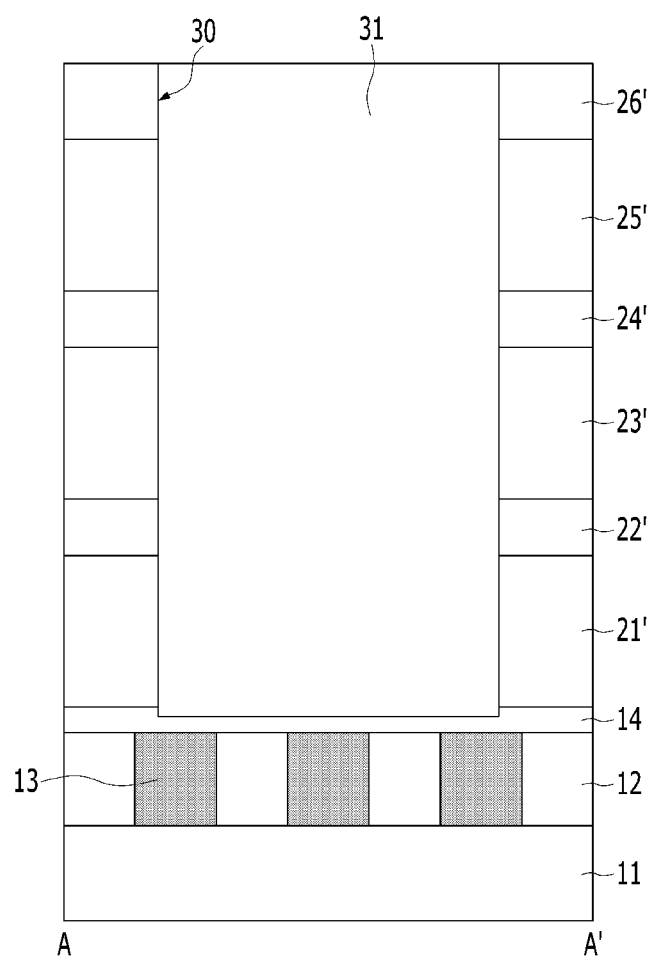

As shown in FIGS. 3A and 3B, a sacrificial layer 31 for gap-filling the supporter hole 30 is formed. The sacrificial layer 31 may provide a lower electrode opening together with the stack structure in a subsequent process. The upper surface of the sacrificial layer 31 may be at the same level as the upper surface of the third supporter 26, that is, the upper surface of the stack structure. The sacrificial layer 31 may be formed, for example, by any suitable deposition process to gap-fill the supporter hole 30, followed by a planarization process so that the upper surface of the sacrificial layer 31 is at the same level as the upper surface of the third supporter 26. The planarization process may be, for example, a chemical mechanical polishing process.

The sacrificial layer 31 may include a material having the same or similar wet etch selectivity with respect to the first to third mold patterns 21', 23', and 25'. The sacrificial layer 31 may include the same material as the first to third mold patterns 21', 23', and 25'. The sacrificial layer 31 may be etched together with the first to third mold patterns 21', 23', and 25' in a subsequent dip-out process. The sacrificial layer 31 may include a dielectric material. For example, the sacrificial layer 31 may include silicon oxide.

Figure 4A:
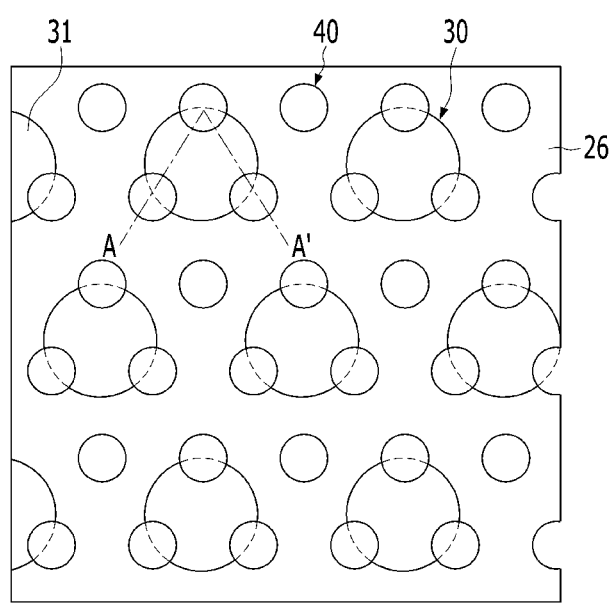
Figure 4B:
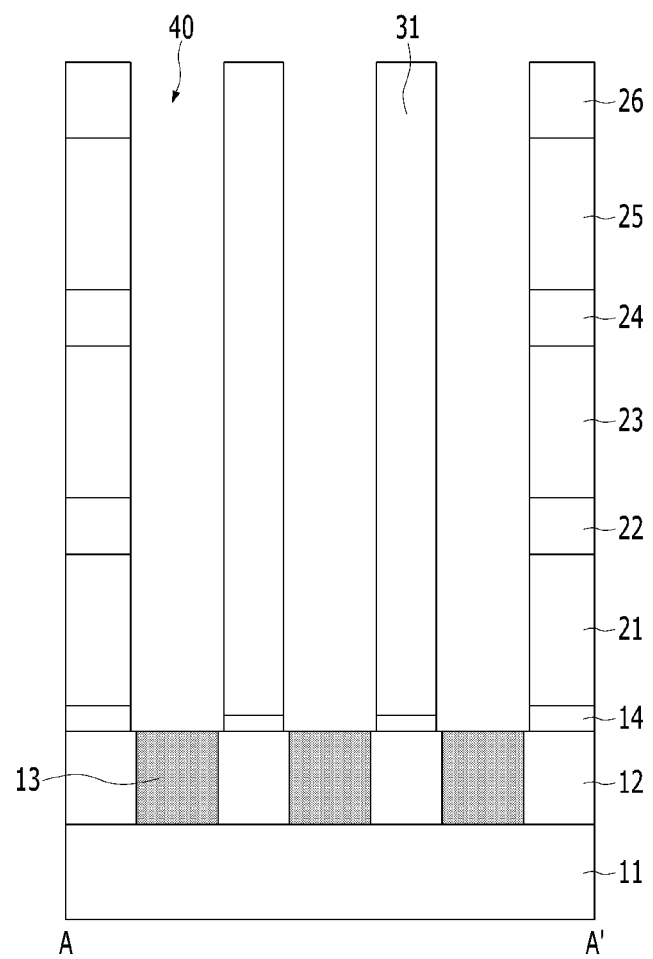

As shown in FIGS. 4A and 4B, a lower electrode opening 40 penetrating through the sacrificial layer 31, the stack structure, and the etch stop layer 14 to expose the storage node contact plug 13 is formed. The stack structure etched to form the lower electrode opening 40 includes a stack structure of a first mold pattern 21, a first supporter 22, a second mold pattern 23, a second supporter 24, a third mold pattern 25, and a third supporter 26.

The lower electrode opening 40 may be formed by forming a mask pattern on the sacrificial layer 31 and the stack structure, and then using the mask pattern as an etch barrier for a series of etching processes for etching the stack structure and the etch stop layer 14.

The lower surface of the lower electrode opening 40 may be at the same level as the upper surface of a corresponding storage node contact plug 13 positioned below the lower electrode opening 40. Each of the lower electrode opening 40 may expose at least a portion of a corresponding one of the storage node contact plugs 13. That is, each of the lower electrode opening 40 may be disposed such that at least a portion thereof overlaps the corresponding storage node contact plug 13. The lower electrode opening 40 may be disposed such that a plurality of lower electrode opening 40 overlap one supporter hole 30. The lower electrode opening 40 may be disposed such that at least two lower electrode opening 40 overlap one supporter hole 30.

The lower electrode opening 40 may have a high aspect ratio. The lower electrode opening 40 may have an aspect ratio of at least 1:1 or more. For example, the lower electrode opening 40 may have a high aspect ratio of 1:10 or more. The aspect ratio may refer to a ratio of width to height.

Figure 5A:
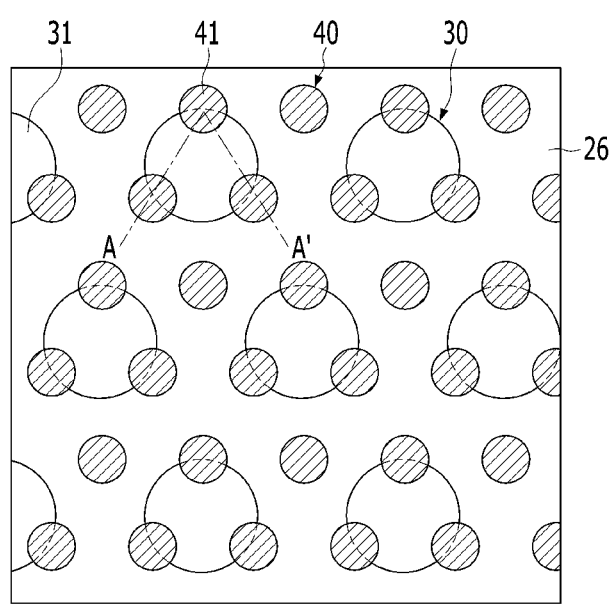
Figure 5B:
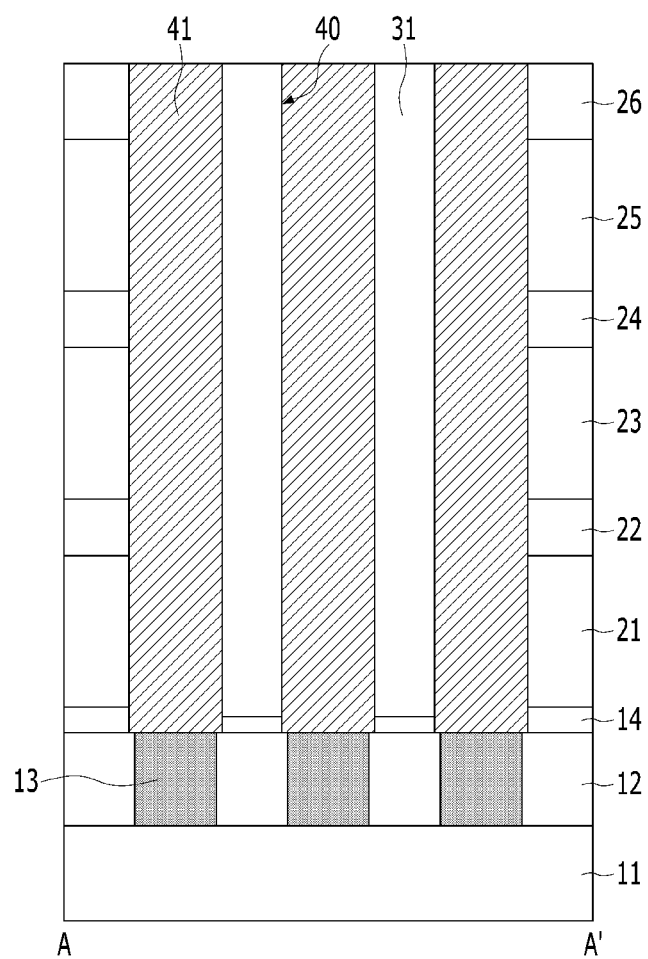

As shown in FIGS. 5A and 5B, a lower electrode 41 is formed which gap-fills the lower electrode opening 40.

The lower electrode 41 may be formed through a series of processes including gap-filling a conductive material in the lower electrode opening 40 and then planarizing the conductive material with a target level of the upper surface of the third supporter 26, so that the conductive material remains in the lower electrode opening 40. The gap-filling process of the lower electrode opening 40 may be performed using any suitable deposition process. Neighboring lower electrodes 41 may be spaced apart from each other by the stack structure and the sacrificial layer 31. For example, the planarization process may be performed by an etch-back process or a chemical mechanical polishing (CMP) process. In another embodiment, in the planarization process, the CMP process may be performed after the etch-back process, or the etch-back process may be performed after the CMP process.

The upper surface of the lower electrode 41 may be at the same level as the upper surface of the third supporter 26, that is, the upper surface of the stack structure.

In the present embodiment, the lower electrode 41 is illustrated having a pillar shape, however, the present disclosure may not be limited to this configuration only. For example, in the embodiment of FIG. 9A, the lower electrode 41a may be formed have a shape of a cylinder along the lower electrode opening 40. Also, as another example, in the embodiment of FIG. 9B, the lower electrode 41b may include a hybrid lower electrode including a pillar-shaped lower electrode that gap-fills the lower electrode opening 40 on the cylinder-shaped lower electrode 41a of FIG. 9A.

For example, the lower electrode 41 may be made of a metal-based material. The metal-based material may refer to a metal-containing material. In another embodiment, the lower electrode may include a stack structure of a metal-based material and a silicon-based material. The silicon-based material may refer to a silicon-containing material. In another embodiment, the lower electrode 41 may include polysilicon, metal, metal nitride, conductive metal oxide, metal silicide, noble metal, or a combination thereof. In another embodiment, the lower electrode 41 may include at least one of titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt), and a combination thereof. In another embodiment, the lower electrode 41 may be made of titanium nitride (TiN). In another embodiment, the lower electrode 41 may include a stack structure of titanium nitride and tungsten.

Figure 6A:
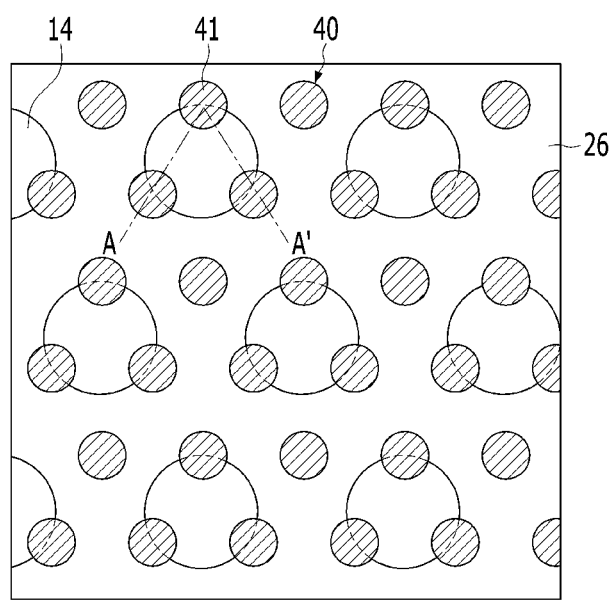
Figure 6B:
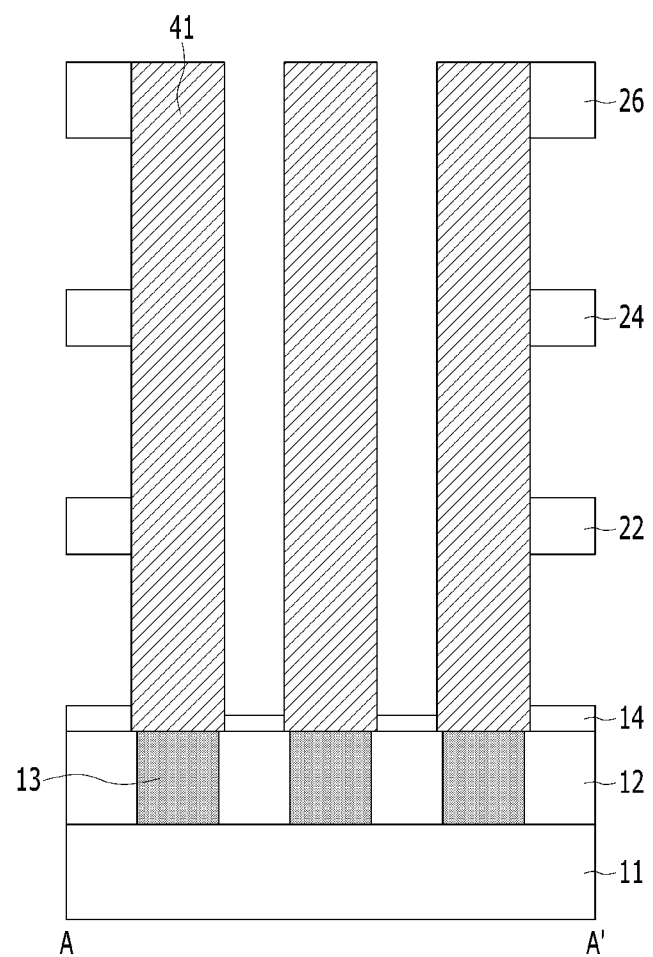

As shown in FIGS. 6A and 6B, the first to third mold patterns 21, 23, and 25 (refer to FIG. 5B) and the sacrificial layer pattern 31 (refer to FIG. 5B) may be removed by performing a dip out process.

Accordingly, the pillar-shaped lower electrode 41 and the first to third supporters 22, 24, and 26 supporting the lower electrode 41 remain. Since the lower electrode 41 is supported by the first to third supporters 22, 24 and 26, it is possible to prevent the lower electrode 41 from leaning during the dip-out process.

The first to third supporters 22, 24, and 26 may be in contact with a part of or the entire circumference of the lower electrode 41. That is, the lower electrode 41 formed to partially overlap the supporter hole 30 may partially contact the first to third supporters 22, 24, and 26. The lower electrode 41 formed in a region excluding the supporter hole 30 may contact the first to third supporters 22, 24, and 26 around the entire circumference.

The dip-out process may be performed using a wet chemical having a wet etch selectivity with respect to the first to third supporters 22, 24, and 26 and the lower electrode 41. For example, one or more wet chemicals may be used for the dip-out process such as HF, $NH_4F/NH_4OH$, $H_2O_2$, HCl, $HNO_3$, and $H_2SO_4$.

As a comparative example, when the supporter etching and dip-out process is performed after the lower electrode 41 is formed, processes of etching the third supporter between the lower electrodes 41, removing the third mold layer through the first dip-out process, etching the second supporter, removing the second mold layer through the second dip-out process, etching the first supporter, and removing the first mold layer through the third dip-out process should be sequentially performed. In other words, in order to remove the mold layer in the stack structure, the supporter etching processes should be performed as many times as the number of the supporters, and the dip-out process should be repeated as many times as the number of mold layers. Accordingly, the etching margin deteriorates as the supporter etching process and the dip-out process are repeated. In addition, since the supporter between the lower electrodes 41 must be selectively etched, etching difficulty is very high. Moreover, if the mask pattern formed on the stack structure for the supporter etching does not cover all of the lower electrode 41, the upper portion of the lower electrode 41 in the portion not covered by the mask pattern may inevitably be damaged during the supporter etching. In addition, when bending or leaning occurs in the lower electrode 41 in the dip-out process, it is difficult to align the lower electrode 41 and the supporter, and etching the supporter between the lower electrode 41 becomes more difficult.

On the other hand, in this embodiment of the present disclosure, a supporter hole is formed in advance before forming the lower electrode opening to secure a passage through which an etchant flows in a subsequent dip-out process, so that all mold layers in the stack structure can be removed in a single dip-out process.

Accordingly, deterioration of the etch margin may be prevented. In addition, even when a multi-layered supporter is applied as in the present embodiment, the alignment between the lower electrode 41 and the supporter may be maintained without being affected by bending of the lower electrode 41 by the dip-out process.

In addition, by pre-etching the supporter hole having a larger area than the lower electrode opening, the etching difficulty can be lowered, and damage to the upper part of the lower electrode 41 can be prevented, thereby securing the reliability of the device.

Figure 7A:
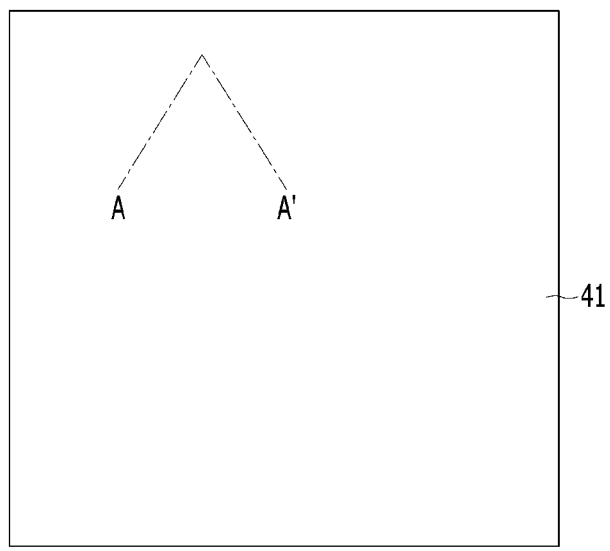

As shown in FIGS. 7A and 7B, the dielectric layer 42 is formed along the entire surface including the lower electrode 41. Next, an upper electrode 43 is formed on the dielectric layer 42.

The dielectric layer 42 may be formed on the surface of the lower electrode 41 and the surfaces of the first to third supporters 22, 24, and 26 between the lower electrodes 41. The dielectric layer 42 may be formed in one of a single layered structure, a multi-layered structure, or a laminated structure. The dielectric layer 42 may have a doping structure or an intermixing structure. For example, the dielectric layer 42 may include a high-k material. The dielectric layer 42 may have a higher dielectric constant than silicon oxide ($SiO_2$). Silicon oxide may have a dielectric constant of about 3.9, and the dielectric layer 42 may include a material having a dielectric constant of 4 or more. The high-k material may have a dielectric constant of about 20 or more. For example, the high dielectric constant material may include hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). In another embodiment, the dielectric layer 42 may be formed of a composite layer including two or more layers of the aforementioned high-k materials. For example, the dielectric layer 42 may be formed of zirconium-based oxide (Zr-based oxide). For example, the dielectric layer 42 may have a stack structure including zirconium oxide ($ZrO_2$). For example, the stack structure including zirconium oxide ($ZrO_2$) may include ZA ($ZrO_2/Al_2O_3$) or ZAZ ($ZrO_2/Al_2O_3/ZrO_2$). ZA may have a structure in which aluminum oxide is stacked on zirconium oxide. ZAZ may have a structure in which zirconium oxide, aluminum oxide, and zirconium oxide are sequentially stacked. $ZrO_2$, ZA and ZAZ may be referred to as a zirconium oxide-based layer ($ZrO_2$-based layer).

In another embodiment, the dielectric layer 42 may be formed of hafnium-based oxide (Hf-based oxide). For example, the dielectric layer 42 may have a stack structure including hafnium oxide ($HfO_2$). For example, a stack structure including hafnium oxide ($HfO_2$) may include HA ($HfO_2/Al_2O_3$) or HAH ($HfO_2/Al_2O_3/HfO_2$). HA may have a structure in which aluminum oxide is stacked on hafnium oxide. The HAH may have a structure in which hafnium oxide, aluminum oxide, and hafnium oxide are sequentially stacked. $HfO_2$, HA and HAH may be referred to as a hafnium oxide-based layer ($HfO_2$-based layer).

In ZA, ZAZ, HA, and HAH, aluminum oxide ($Al_2O_3$) may have a larger band gap than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer 42 may include a stack of a high-k material and a high-bandgap material having a bandgap greater than that of the high-k material. The dielectric layer 42 may include silicon oxide ($SiO_2$) as a high bandgap material other than aluminum oxide. Since the dielectric layer 42 includes a high bandgap material, leakage current can be suppressed. High bandgap materials can be extremely thin. The high-bandgap material may be thinner than the high-k material.

In another embodiment, the dielectric layer 42 may include a laminate structure in which a high-k material and a high-bandgap material are alternately stacked. For example, the dielectric layer 42 may include ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the above laminate structure, aluminum oxide ($Al_2O_3$) may be extremely thin. In another embodiment, the dielectric layer 42 may include a structure in which a first high-k material is doped with a second high-k material. For example, it may include titanium oxide doped zirconium oxide ($TiO_2$-doped $ZrO_2$) in which titanium oxide ($TiO_2$) is doped into zirconium oxide ($ZrO_2$). In another embodiment, the dielectric layer 42 may include a structure in which different high-k materials are intermixed. For example, it may include TiZrAlO in which zirconium oxide ($ZrO_2$), titanium oxide ($TiO_2$), and aluminum oxide ($Al_2O_3$) are intermixed.

The upper electrode 43 may include, for example, a silicon-containing material, a germanium-containing material, a metal-containing material, or a combination thereof. The upper electrode 43 may include, for example, metal, metal nitride, metal carbide, conductive metal oxide, or a combination thereof. For example, the upper electrode 43 may include titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$), or a combination thereof. For example, the upper electrode 43 may include a silicon layer (Si layer), a germanium layer (Ge layer), a silicon germanium layer (SiGe layer), or a combination thereof. In another embodiment, the upper electrode 43 may be formed by stacking a silicon germanium layer on a silicon layer (Si/SiGe). In another embodiment, the upper electrode 43 may be formed by stacking a silicon germanium layer on the germanium layer (Ge/SiGe). In another embodiment, the upper electrode 43 may include a stack of a silicon-containing material and a metal-containing material. In another embodiment, the upper electrode 43 may be formed by stacking a silicon germanium layer and a metal nitride. In another embodiment, the upper electrode 43 may be formed by stacking a silicon germanium layer and a tungsten nitride layer on titanium nitride (TiN/SiGe/WN).

The present invention described above is not limited to the above-described embodiments and the accompanying drawings, and it will be apparent to those skilled in the art that various substitutions, modifications, and changes may be made thereto without departing from the spirit and scope of the present invention.

What is claimed is:

1. A method of fabricating a semiconductor device, the method comprising:
    sequentially forming a substructure over a substrate and a etch stop layer over the substructure;
    forming a stack structure of alternately stacked mold layers and supporter layers over the etch stop layer;
    forming a plurality of supporter holes in the stack structure exposing the etch stop layer;
    forming a sacrificial layer filling each of the plurality of the supporter holes;
    forming a plurality of lower electrode openings exposing the substructure by etching the sacrificial layer and the stack structure; and
    forming a lower electrode inside the plurality of lower electrode openings.

2. The method of claim 1, wherein a width of each of the plurality of the supporter holes is greater than a width of each of the plurality of the lower electrode openings.

3. The method of claim 1, wherein the plurality of the supporter holes are spaced apart from each other.

4. The method of claim 1, wherein the plurality of the lower electrode openings are spaced apart from each other.

5. The method of claim 1, wherein at least two of the plurality of the lower electrode openings overlap each of the plurality of the supporter holes.

6. The method of claim 5, wherein the at least two lower electrode openings overlapping each of the plurality of the supporter holes are partially surrounded by the stack structure.

7. The method of claim 1, wherein the lower electrode openings, which do not overlap any of the plurality of the supporter holes, are fully surrounded by the stack structure.

8. The method of claim 1, wherein each of the plurality of the supporter holes has a circular or elliptical shape.

9. The method of claim 1, wherein each of the plurality of the supporter holes has a shape of one of a polygonal shape, a bar shape, and a line shape.

10. The method of claim 1, wherein the mold layers are formed of a material having a different wet etch selectivity from the supporter layers.

11. The method of claim 1, wherein the sacrificial layer is formed of a material having a different wet etch selectivity from the supporter layers.

12. The method of claim 1, wherein the mold layers are formed of a material having a similar wet etch selectivity as the sacrificial layer.

13. The method of claim 1, wherein the mold layers include silicon oxide.

14. The method of claim 1, wherein the supporter layers include silicon nitride.

15. The method of claim 1, wherein the sacrificial layer includes silicon oxide.

16. The method of claim 1, after the forming of the lower electrode, further including:
    removing the sacrificial layer and the mold layers from the stack structure through a dip-out process;
    forming a dielectric layer along an entire surface including the lower electrode; and
    forming an upper electrode over the dielectric layer.

17. The method of claim 16, wherein the dip-out process uses a wet chemical to remove the mold layers and the sacrificial layer.

18. The method of claim 1, wherein the dip-out process uses a wet chemical having an etch selectivity with respect to the plurality of the supporter layers.

19. The method of claim 1, wherein the dip-out process uses a wet chemical selected from HF, $NH_4F/NH_4OH$, $H_2O_2$, HCL, $HNO_3$, $H_2SO_4$, and a combination thereof.

20. The method of claim 1, wherein the lower electrode has a pillar shape or a cylindrical shape.

21. The method of claim 1, wherein the lower electrode is formed of a stack structure including a first lower electrode having a cylindrical shape and a second lower electrode disposed inside the first lower electrode and having a pillar shape.

22. The method of claim 1, wherein the sequentially forming of the substructure and the etch stop layer over the substrate includes:
    forming an interlayer dielectric layer over the substrate;
    forming a storage node contact plug penetrating through the interlayer dielectric layer and connecting to the substrate; and
    forming the etch stop layer over the storage node contact plug and the interlayer dielectric layer.

23. The method of claim 22, before the forming of the interlayer dielectric layer, further including:
    forming a buried gate structure inside the substrate; and
    forming a bit line structure over the substrate.

* * * * *